US008978004B2

(12) United States Patent
Maziasz et al.

(10) Patent No.: US 8,978,004 B2
(45) Date of Patent: Mar. 10, 2015

(54) CELL ROUTABILITY PRIORITIZATION

(75) Inventors: Robert L. Maziasz, Austin, TX (US); Alexander L. Kerre, Solnechnogorsk (RU); Vladimir P. Rozenfeld, Andreevka (RU); Mikhail A. Sotnikov, Zelenograd (RU); Igor G. Topouzov, Zelenograd (RU)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/529,601

(22) Filed: Jun. 21, 2012

(65) Prior Publication Data

US 2013/0212549 A1     Aug. 15, 2013

(51) Int. Cl.
*G06F 17/50*     (2006.01)
(52) U.S. Cl.
USPC .......................................... 716/126; 716/132
(58) Field of Classification Search
CPC ................................ G06F 17/50; G06F 9/455
USPC ................................................ 716/126, 132
See application file for complete search history.

(56) References Cited

U.S. PATENT DOCUMENTS

| | | | |
|---|---|---|---|
| 5,784,600 A * | 7/1998 | Doreswamy et al. | 713/503 |
| 7,225,423 B2 * | 5/2007 | Bhattacharya et al. | 716/102 |
| 8,159,268 B1 * | 4/2012 | Madurawe | 326/47 |
| 8,549,450 B1 * | 10/2013 | Burstein | 716/106 |
| 2002/0069396 A1 | 6/2002 | Bhattacharya et al. | |
| 2010/0155783 A1 | 6/2010 | Law et al. | |
| 2010/0199252 A1 | 8/2010 | Torvi et al. | |

OTHER PUBLICATIONS

Baltus, D. et al., "Developing a Concurrent Methodology for Standard-Cell Library Generation," Proceedings of the 34th Annual Design Automation Conference; New York, 1997; ISBN:0-89791-920-3; 4 pages.

Tsay, Ren-Song, "From Academic Ideas to Practical Physical Design Tools," Proceedings of the 2011 International Symposium on Physical Design; Mar. 27-30, 2011; ISBN: 978-1-4503-0550-1; pp. 9-12.

* cited by examiner

*Primary Examiner* — Thuan Do

(57) ABSTRACT

A layout of a standard cell is created by prioritizing routability characteristics of the standard cell layout. The routability characteristics are prioritized so that the characteristics that are more likely to enhance routing efficiency are emphasized in the cell layout. The prioritization of the routability characteristics can be indicated by a set of weights, with each weight in the set indicating the priority of a corresponding routability characteristic of the standard cell layout. The weights can be used to calculate a weighted sum of the routability characteristics of the standard cell, thereby providing a way to efficiently compare the routability of different standard cell layouts.

20 Claims, 6 Drawing Sheets

CELL ROUTABILITY PRIORITIZATION

CROSS-REFERENCE TO RELATED APPLICATION(S)

This application claims priority to International Application Number PCT/RU2012/000108 filed on Feb. 10, 2012, and entitled "Cell Routability Prioritization," the disclosure of which is hereby expressly incorporated by reference in its entirety.

FIELD OF THE DISCLOSURE

The present disclosure to relates data processing device design, and more particularly to cell routability for a data processing device design.

BACKGROUND

An integrated circuit device can be created using automated layout tools that place standard cells, and the connections between the standard cells, in an arrangement based on both the design of the integrated circuit device and specified layout rules. The resulting configuration of cells and connections is referred to as the device layout, and is used as a basis for forming the integrated circuit device. The device layout depends in part on the routability of the layout of each of the standard cells. However, because the standard cells can be used in different device designs, the routability of the standard cells can be difficult to determine.

BRIEF DESCRIPTION OF THE DRAWINGS

The present disclosure may be better understood, and its numerous features and advantages made apparent to those skilled in the art by referencing the accompanying drawings.

DETAILED DESCRIPTION

Techniques for creating a layout of a standard cell for a data processing device design by prioritizing routability characteristics of the standard cell layout are disclosed. The routability characteristics are categories of layout features that facilitate the routing of connections between the standard cell and other cells of the data processing device design. The routability characteristics are prioritized so that the characteristics that are more likely to enhance routing efficiency are emphasized in the cell layout. Routability characteristics can be weighted, with each weight indicating the priority of a corresponding routability characteristic of the standard cell layout. The weights can be used to calculate a weighted sum of the routability characteristics of the standard cell, thereby providing a way to efficiently compare the routability of different standard cell layouts.

A standard cell can include a number of routability characteristics, such as the number of points in the input/output nets of the cell that are accessible via a side of the cell, the number of points in the cell that can allow routing to different input/output nets, the number of points in the cell that can allow routing to the input/output nets of the cell itself or to a different standard cell, and the like. In an embodiment, the impact of increasing the number of each routability characteristic on the size of a test block including the standard cell is empirically determined by testing a number of test block routing configurations. The results indicate the likely relative impact of each routability characteristic on the efficiency of a device layout. The routability characteristics can therefore be prioritized, so that the standard cell layout can be modified to emphasize those routability characteristics that are more likely to result in a more efficient device layout.

Figure 1:
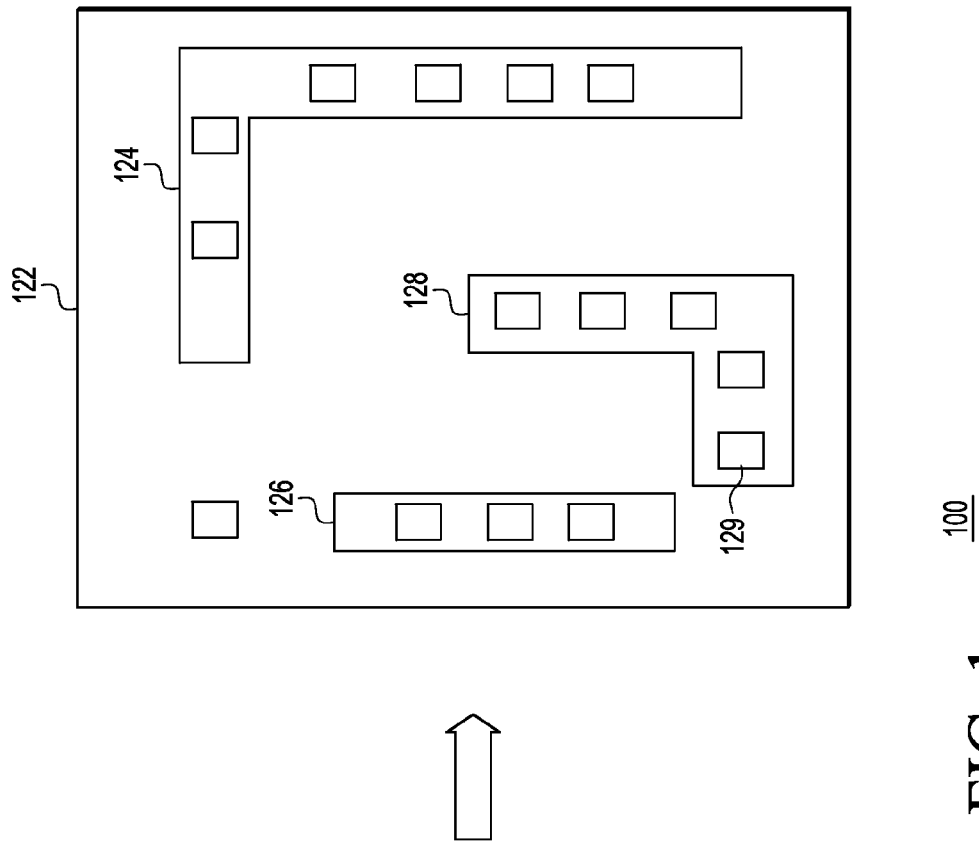
FIG. 1 is a block diagram of layouts of a standard cell in accordance with one embodiment of the present disclosure.
Figure 1:
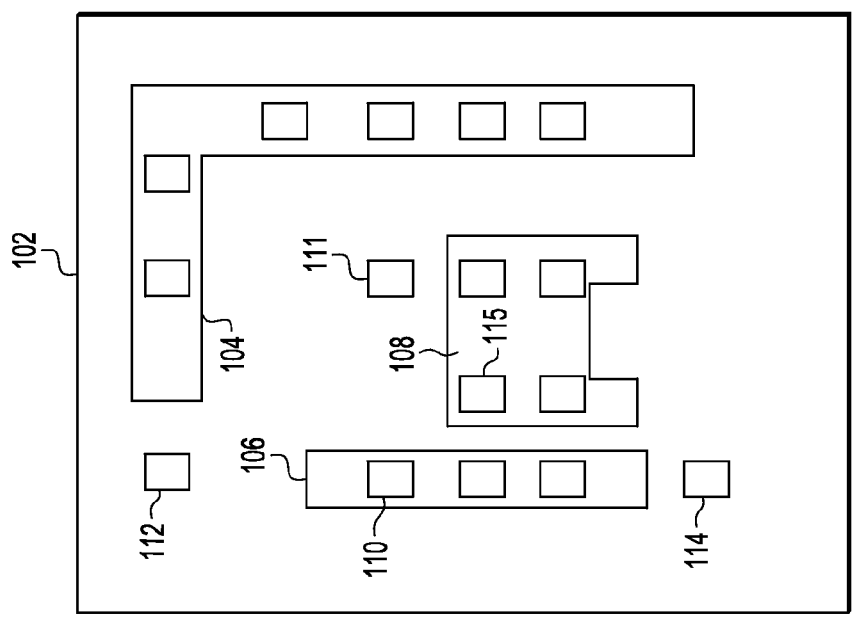

FIG. 1 illustrates two layouts of a standard cell 100 in accordance with one embodiment of the present disclosure. As used herein, a "standard cell" refers to information indicating the connectivity, placement, and layout, of two or more transistors. Accordingly, the standard cell can represent a single logic gate, a collection of logic gates, a storage element, or combination thereof, or any other arrangement of transistors. In the illustrated example of FIG. 1, layout 102 provides the layout of the standard cell 100 prior to modification of the routability characteristics of the cell. Layout 122 provides the layout of the standard cell 100 after modification.

Layout 102 includes a number of input/output (I/O) nets, including I/O nets 104, 106, and 108. As used herein, an I/O net is a portion of a standard cell that provides an input or an output to the cell. Thus, for example, in an embodiment the standard cell 100 represents an AND gate, the I/O nets 106 and 108 each represent a different input to the AND gate, and the I/O net 104 represents the output of the AND gate. The I/O nets are the portions of the standard cell 100 which are subject to connection to other standard cells in a device layout. For example, a data processing device layout can be formed by arranging standard cells in a row and column format, and routing connections between the I/O nets of the standard cells to implement the device design.

In an embodiment, each of the I/O nets of the standard cell are to be formed at a designated integrated circuit layer (referred to for purposes of discussion as Layer 1) of the data processing device, such as a metal 1 layer. Connections are made between the I/O nets by establishing a connection from an I/O net of one standard cell (standard cell A) to another layer (referred to as Layer 2), such as a metal 2 layer, routing a connection at Layer 2 to close proximity to another standard cell (standard cell B), and establishing a connection from Layer 2 to an I/O net of standard cell B at Layer 1. In some cases, a connection can be established between Layer 2 and an I/O net at Layer 1 by placing a via directly between the I/O net and the Layer 2. In other cases, other connections at layer 2 prevent placing the via in this fashion. Accordingly, in some cases the connection is established by placing the via in close proximity to the I/O net at Layer 1, and routing a connection at Layer 1 between the I/O net and the via.

As used herein, the routability of a standard cell layout refers to the number of different routing paths available in the cell layout by which a layout tool can route connections to the cell's I/O nets, or the I/O nets of a neighboring cell, and to the complexity of those routing paths. Thus, a standard cell layout arranged such that one of its I/O nets can only be connected to Layer 2 by routing the connection along a single path has less routability than a layout of the same cell arranged such that the I/O net can be connected to Layer 2 along 2 or more paths, all other features of the layout being equal. Further, a standard cell layout that requires a more complex route (e.g. a route with more turns or changes of direction) to route to a particular I/O net is less routable than layout of the same cell that allows for a simpler route to the I/O net, all other things in the layouts being equal. The routability of a standard cell layout can depend on a number of factors such as, for example, the geometry and relative arrangement of the cell's I/O nets, the size of the I/O nets, the amount of space in the cell that would allow a connection to more than one of the I/O nets, the amount of space in the cell that would allow a connection to either an I/O net of the standard cell itself or an adjoining standard cell, and the like.

As used herein, a hitpoint refers to designated locations in a standard cell layout where a layout tool can, relative to other locations of the standard cell, more easily establish or route a connection without having to employ a complex routing path. For example, the layout 102 illustrates a number of hitpoints, including hitpoints 110, 111, 112, 114, and 115. In one embodiment the layout tool employs grid-based layout techniques, wherein the layout tool can more easily establish connections at intersections of the grid than at other locations. Further, the layout tool can establish connections only between real and shared hitpoints that lie along the same lines of the grid. Thus, in the illustrated example of FIG. 1, the layout tool could establish a connection between the hitpoints 110 and 111, but not between the hitpoints 111 and 115.

Some hitpoints, referred to as real hitpoints, indicate locations where a connection can be made to the I/O net. For example, each of the I/O nets 104, 106, and 108 are real hitpoints. In the illustrated embodiment, the I/O net 104 includes 6 real hitpoints, the I/O net 106 includes 3 real hitpoints, and the I/O net 108 includes 4 real hitpoints. Real hitpoints are referred to as real to differentiate the hitpoints from other hitpoint types, described further below.

A shared hitpoint is a location where a via or other connection could be established that can then be connected to more than one I/O net of a standard cell. The hitpoint 111 is a shared hitpoint. Thus, if a via were placed at hitpoint 111, a connection could be established from the via to one of the I/O net 106 (at hitpoint 110), I/O net 104, or I/O net 108. Hitpoint 112 is also a shared hitpoint with respect to I/O nets 104 and 106.

External hitpoints are locations where connections, such as vias, can be placed such that a connection could be established to an I/O net of the standard cell including the hitpoint, or to an I/O net of an adjoining cell. The hitpoints 112 and 114 are external hitpoints. Accordingly, if a via were placed at hitpoint 112 the layout tool could establish a connection from the via to one of I/O nets 104 and 106, or could establish a connection from the via to another standard cell adjoining the left side of the standard cell 100. Note that a hitpoint can be classified into more than one category. Thus, hitpoint 112 is both a shared hitpoint and an external hitpoint.

In an embodiment, connections are routed between hitpoints along tracks at each layer, where a track is a routing path preferred by the layout tool, such as a grid line. The routability of a standard cell layout typically increases as the number of tracks that can be used to route to the cell's I/O nets increases. However, tracks can be blocked by other features of the cell's layout, such as connections between internal components of the cell.

The number, classes, arrangement, and other features of the hitpoints and I/O nets of the layout 102 affect the routability of the layout. For example, the average number of real hitpoints at each I/O net of the layout 102 can affect the routability of the layout because, all other things being equal, having more hitpoints at each I/O net increases the number of paths along which a layout tool can route connections in a device layout.

A routability characteristic refers to a feature of a standard cell layout that can affect the routability of the layout. Examples of routability characteristics can include the number of real hitpoints in the cell, the average number of real hitpoints per I/O net of the cell, the number of shared hitpoints in the cell, the number of external hitpoints in the cell, the number of connections that can be made to an I/O net without overlapping another connection or layout feature (referred to as valid connections), the number of blocked tracks, the width, length, or area of the cell layout, the number of I/O nets having only one hitpoint, the minimum number of hitpoints any I/O net has, the number of different tracks that coincide with a different hitpoint of a given I/O net, and the like.

It is desirable to create or modify the routability of a standard cell in such a way that using the standard cell in a device design is more likely to result in an area efficient device layout. That is, less routable cells can result in layouts that consume more area, increasing design difficulty such as packaging design, increasing potential timing errors in the device, increasing power consumption, and the like. However, some routability characteristics of a standard cell can be in tension. For example, increasing the number of hitpoints at the I/O nets of a cell layout typically increases the size of the nets such that, depending on the shape of the I/O nets, the number of shared hitpoints or external hitpoints is reduced.

To account for the tension between the routability characteristics and determine which characteristics are more likely to enhance routability of a standard cell, a layout tool can prioritize a set of routability characteristics for a standard cell according to each characteristic's corresponding predicted impact on the size of a layout of a block that includes the standard cell. For example, in one embodiment a set of tests is run whereby different standard cell layouts, having different routability characteristic values, are placed in a series of test block layouts. The impact of the different routability characteristics on features of the block layout, such as the layout size, are measured and based on the impact the routability characteristics are prioritized.

The layout of a standard cell can be modified to emphasize particular routability characteristics according to the determined prioritization. This can be better understood with reference to layout 122 of FIG. 1. Layout 122 is a layout of the standard cell 100 after modifying the cell based on a prioritization of routability characteristics. Layout 122 includes I/O nets 124, 126, and 128, each corresponding to an I/O net of layout 102. In particular, I/O net 124 corresponds to I/O net 104, I/O net 126 corresponds to I/O net 106, and I/O net 128 corresponds to I/O net 108. It is assumed for purposes of discussion that, based on empirical analysis of layout tool behavior, the number of real hitpoints and the number of connections that can be made to real hitpoints, on average, have a higher impact on the routability of standard cell 100 than the number of shared hitpoints and the number of external hitpoints. Accordingly, layout 102 can be modified to a layout 122, which includes a greater number of real hitpoints and a greater number of connections that can be made to the real hitpoints as compared to layout 102, while having fewer external hitpoints and shared hitpoints.

To illustrate, for layout 122 the I/O net 108 has been reshaped, resulting in I/O net 128. I/O net 128 has a greater number of real hitpoints (5) than I/O net 108 (which has 4 real hitpoints). Further, more connections can be made to the real hitpoints of I/O net 128, because there are three real hitpoints that can be accessed from the lower side of the cell, and one (hitpoint 129) that can be accessed from the left side of the cell whereas for I/O net 108 has only two real hitpoints that can be accessed via the lower side, and none that can be accessed from the left side. The reshaping of I/O net 108 has resulted in the elimination of shared hitpoint 111 and the elimination of external hitpoint 114. However, because the layout 122 represents a modification of the layout 102 based on a prioritization of routability characteristics, it is expected that the layout 122 will be more routable in a greater number of contexts than layout 102.

In an embodiment, the routability of a cell can be quantified by a weighted sum of the routability characteristics of a layout, where the weights of the sum are based on the prioritization of the routability characteristics. To illustrate, the weighted sum can be expressed as follows:

$$CWRM = W1*RC1 + W2*RC2 + \ldots Wn*RCn$$

where CWRM is the combined weighted routability metric, a number that indicates the routability of a standard cell layout; W1, W2, ... Wn are the set of weights associated with the set of routability characteristics; and the values RC1, RC2, ... RCn are the set of routability characteristics. Thus, for example, RC1 is the number of real hitpoints in the layout, and W1 is the weight associated with the number of real hitpoints. In an embodiment, a higher weight indicates that the associated routability characteristic has a higher priority than a routability characteristic associated with a lower value weight. The CWRM value provides a numerical indication of the routability of a cell layout, allowing the routability of different cell layouts to be more easily compared.

Figure 2:
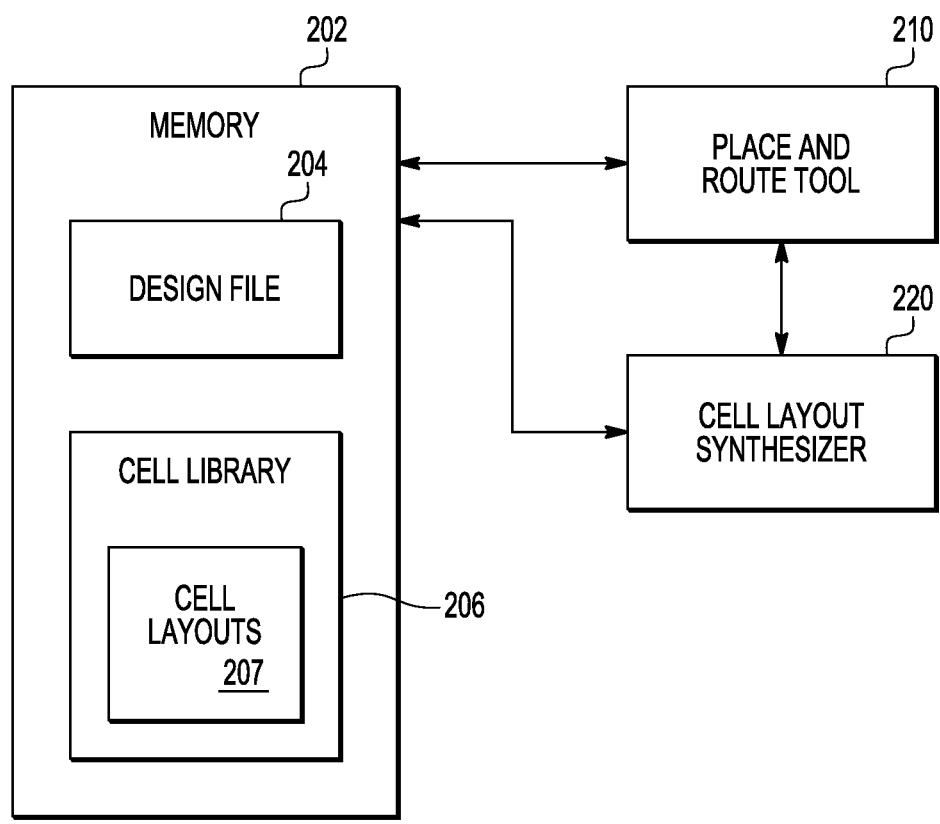
FIG. 2 is a block diagram of an integrated circuit device design system in accordance with one embodiment of the present disclosure.

FIG. 2 illustrates a layout design system 200 in accordance with one embodiment of the present disclosure. The design system 200 includes a place and route tool 210, a cell layout synthesizer 220, and a memory 202. The memory 202 stores a design file 204 and a cell library 206. The design file includes netlist and other information for a particular design of a data processing device. The cell library 206 stores netlist information for a library of standard cells. The cell library also includes cell layouts 207, which stores information indicating one or more layouts for each standard cell in the library. The cell layouts 207 therefore stores information indicating the position, size, orientation, and other features of the I/O nets and other components for each layout.

The place and route tool 210 is a device, such as a computer, configured to place standard cell layouts and route connections between the layouts based on an input netlist. To perform placement and routing, the place and route tool 210 employs cell layouts provided by the cell layout synthesizer 220. The cell layout synthesizer 220 is a device, such as a computer, configured to determine the prioritization of routability characteristics for the standard cells stored at cell library 206 in accordance with embodiments of the present disclosure. Based on the prioritization, the cell layout synthesizer 220 can determine a cell layout for each standard cell to emphasize routability characteristics having greater priority.

Figure 3:
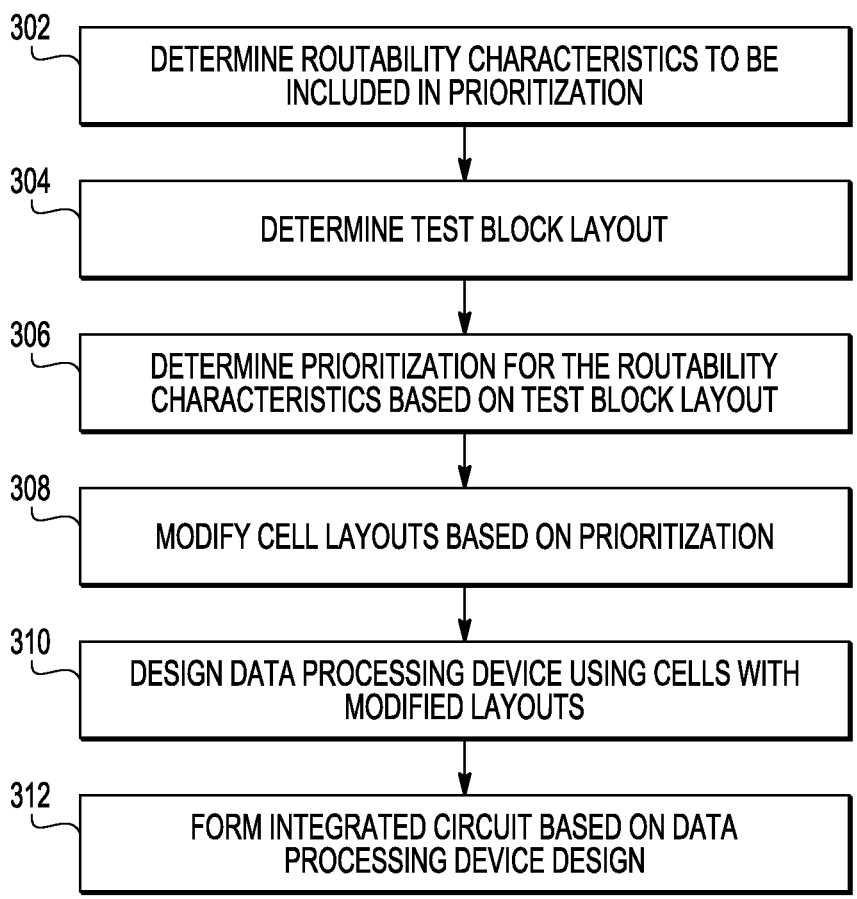
FIG. 3 is a flow diagram of a method of modifying a cell layout based on a prioritization of routability characteristics in accordance with one embodiment of the present disclosure.

The operation of the layout design system 200 can be better understood with reference to FIG. 3, which illustrates a flow diagram of a method of creating a standard cell layout in accordance with one embodiment of the present disclosure. At block 302, the cell layout synthesizer module 302 selects the routability characteristics to be included in the prioritization. In one embodiment, all available routability characteristics are selected. In another embodiment, the routability characteristics are selected based on statistical information collected from the place and route tool 210 indicating the frequency with which particular routing features, such as external hitpoints, are used in a set of data processing device designs.

At block 304, the place and route tool 210 determines one or more layouts for a test block. The test block is a set of standard cells from the cell library 206, arranged for layout. The test block can be a portion of the design file 204, or can be a specialized arrangement of standard cells for test. At block 306, the cell layout synthesizer 220 determines the prioritization for the routability characteristics selected at block 302 using the test block layout determined at block 304. As described further herein, in one embodiment the cell layout synthesizer 220 determines the prioritization by creating different layouts for at least one standard cell in the test block, with each layout having different routability characteristics, and determining the impact of each layout on the size of the resulting test block layout.

At block 308, the cell layout synthesizer 220 modifies the layout of at least one standard cell to emphasize those routability characteristics having higher priority, even if such modification de-emphasizes routability characteristics having lower priority. At block 310, the cell layout synthesizer 220 calculates the CWRM for the original layout of each standard cell and the CWRM for each modified layout of the corresponding standard cell. The cell layout synthesizer 220 can compare the CWRM values to determine the layout for the cell that is predicted to have the greatest routability, and select the layout as the layout to be used for the standard cell.

To illustrate, the cell layout synthesizer 220 can modify the layout of a standard cell from original layout A to modified layout B. The cell layout synthesizer 220 can determine the CWRM score for original layout A to be 56 and the CWRM score for modified layout B to be 65. The higher CWRM for layout B indicates that it is predicted to have greater routability than layout A. Accordingly, the cell layout synthesizer 220 can select layout B as the layout to be used for the standard cell.

In an embodiment, the cell layout synthesizer can 220 can create multiple modified layouts for the standard cell with each layout emphasizing different routability characteristics. The cell layout synthesizer can use the CWRM score for each layout to select amongst the layouts. For example, the cell layout synthesizer 220 can modify the layout of a standard cell from original layout A to modified layout B, and also create a second modified layout C. The cell layout synthesizer 220 can determine the CWRM score for original layout A to be 56, the CWRM score for modified layout B to be 65, and the score for modified layout C to be 71. The higher CWRM for layout C indicates that it is predicted to have greater routability than layout A and layout B. Accordingly, the cell layout synthesizer 220 can select layout C as the layout to be used for the standard cell.

At block 310, a design tool incorporates at least one standard cell having a modified layout from block 308 in data processing device design, such as design file 204. At block 312 an integrated circuit is formed based on the data processing device design.

Figure 4:
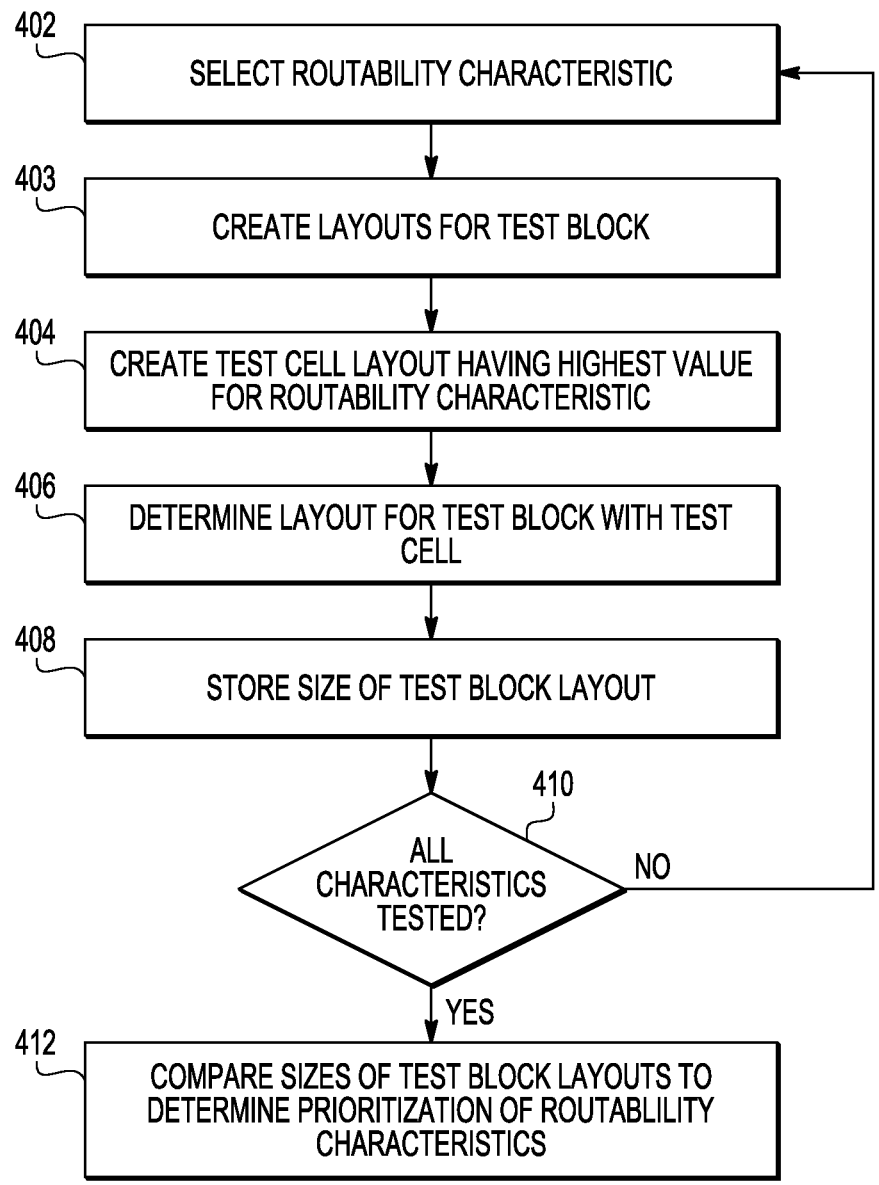
FIG. 4 is a flow diagram of a method of determining prioritization of routability characteristics of a standard cell in accordance with one embodiment of the present disclosure.

FIG. 4 illustrates a flow diagram of a method of determining the prioritization of a set of routability characteristics in accordance with one embodiment of the present disclosure. At block 402, the cell layout synthesizer 220 selects one of the routability characteristics which is to be included in the prioritization. At block 403, the cell layout synthesizer 220 creates a test block by selecting a set of one or more test standard cells. In one embodiment, the test standard cells correspond to a set of cells used most frequently in a selected data processing device design. Further, in one embodiment, the cell layout synthesizer 220 creates the test block by determining test layouts for each of the standard cells in the test set such that the layouts have, for each cell, the lowest possible values for each of the routability characteristics to be tested.

At block 404, the cell layout synthesizer 220 selects one of the standard cells in the test block as the test cell, and creates a layout for the test cell having the highest possible value for the selected routability characteristic that can be created by the cell layout synthesizer 220 with selected design rules. At block 406, the place and route tool 210 places the test standard cell in the test block, using the cell layout created at block 404, and determines a layout for the test block with the test standard cell. At block 408 the cell layout synthesizer 220 determines and stores the size of the test block layout and associates the stored size with the previously selected routability characteristic.

At block 410, the cell layout synthesizer 220 determines whether all routability characteristics to be prioritized have been tested. If not, the method flow returns to block 402 and another routability characteristic is selected. If all routability characteristics to be prioritized have been selected, the method flow proceeds to block 412 and the cell layout synthesizer 220 compares the stored sizes for each routability characteristic to determine the prioritization for the routability characteristic. For example, in one embodiment, the routability characteristic associated with the smallest test block layout is given the highest priority, the routability characteristic associated with the next-smallest test block layout is given the next-highest priority, and so on until the routability characteristic associated with the largest test block layout is given the lowest priority.

Figure 5:
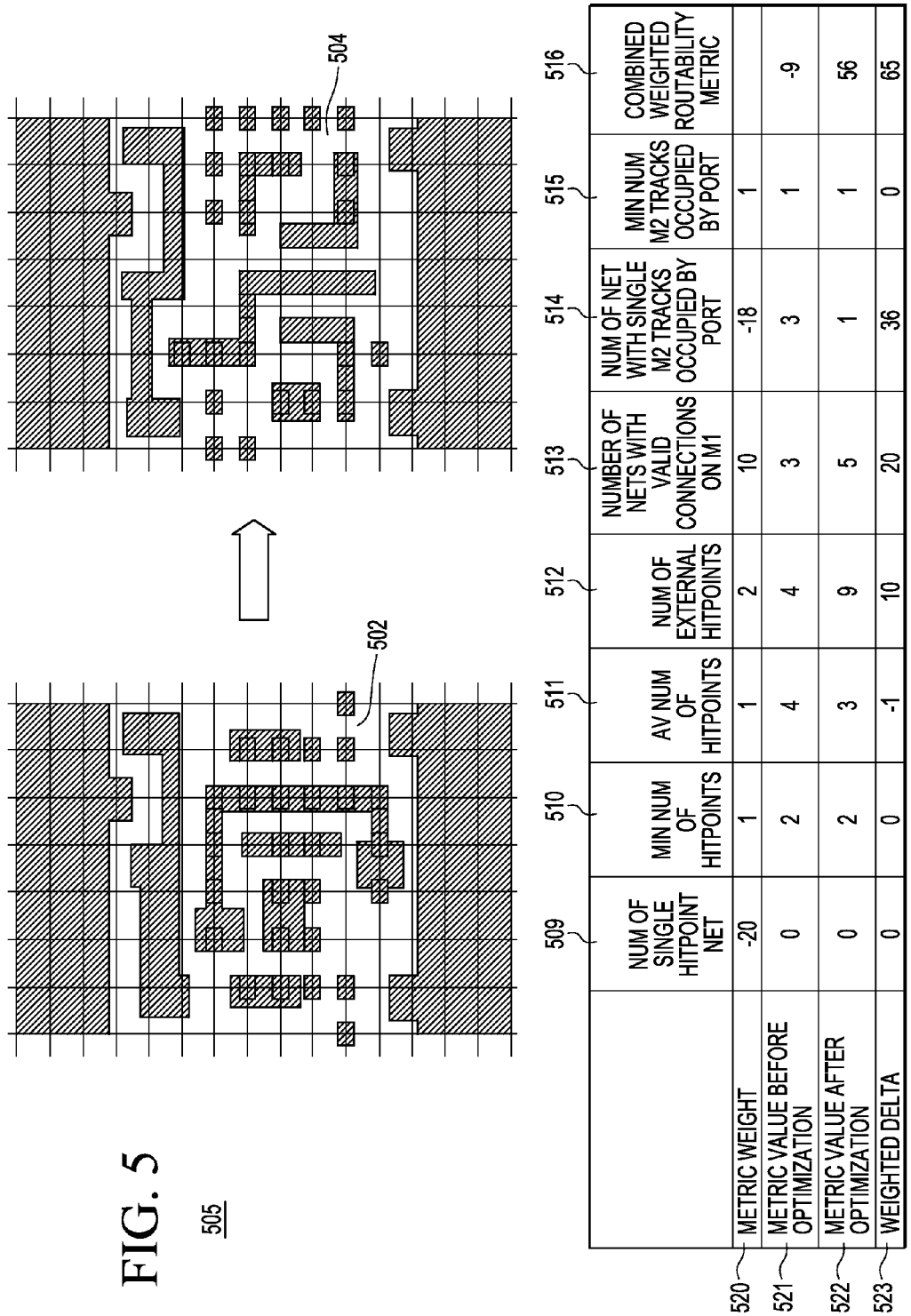
FIG. 5 is diagram illustrating modification of a standard cell layout based on prioritization of routability characteristics in accordance with one embodiment of the present disclosure.

FIG. 5 is a diagram illustrating modification of a standard cell layout based on prioritization of routability characteristics in accordance with one embodiment of the present disclosure. The layout 502 illustrates the layout of a standard cell prior to modification, and the layout 504 illustrates the layout 504 after modification. FIG. 5 also illustrates a table 505 showing the routability characteristics for each of the layouts 502 and 504, the prioritization of the routability characteristics, and the CWRM score for each of the layouts 502 and 504. In particular, columns 509-515 of table 505 indicate the value associated with a particular routablity characteristic, while column 516 indicates CWRM values. Row 520 indicates the weight, and therefore the priority, associated with each of the routability characteristic, with a higher weight magnitude (the absolute value of the value indicated at the table) indicating a higher priority. A negative number in this column indicates that routability is expected to be improved by reducing the value of the associated routability characteristic (e.g. reducing the number of I/O nets having a single hitpoint). Row 521 indicates the value of the routability characteristic for layout 502 and row 522 indicates the value of the routability characteristic for layout 504.

Accordingly, in the illustrated example of FIG. 5, table 505 indicates that the highest priority routability characteristic is the number of I/O nets with a single hitpoint, followed by the number of I/O nets with single Metal 2 tracks occupied by a port, followed by the number of I/O nets that can have valid connections at the Metal 1 layer, and so on as indicated by the table. As further indicated by rows 521 and 522 of the table 505, the layout 504 has the same number of single hitpoint I/O nets, a higher number of nets with valid connections at the Metal 1 layer, and a lower number of nets with single Metal 2 tracks occupied by a port as compared to the layout 502. Thus, each of these relatively high-priority routability characteristics has been enhanced relative to layout 502. In contrast, some of the relatively low-priority routability characteristics have been reduced in layout 504, such as the average number of real hitpoints as indicated at column 511. In other words, the higher priority routability characteristics in layout 504 have been enhanced at a cost of reducing lower priority routability characteristics. This tradeoff results in higher overall routability for the standard cell as indicated by column 516, which shows the CWRM score for the cell increasing from a value of −9 to a value of 56.

Figure 6:
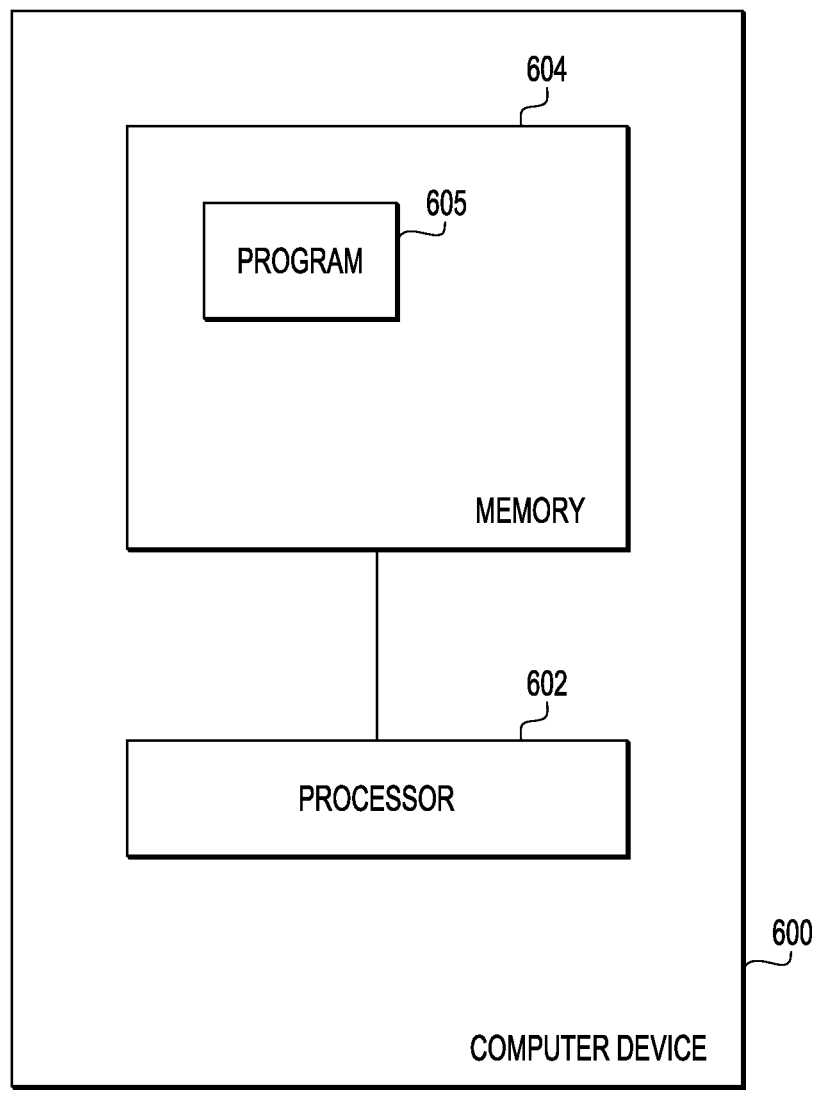
FIG. 6 is a block diagram of a computer device in accordance with one embodiment of the present disclosure.

FIG. 6 illustrates a block diagram of a particular embodiment of a computer device 600. The computer device 600 includes a processor 602 and a memory 604. The memory 604 is accessible to the processor 602.

The processor 602 can be a microprocessor, controller, or other processor capable of executing a set of instructions. The memory 604 is a computer readable storage medium such as random access memory (RAM), non-volatile memory such as flash memory or a hard drive, and the like. The memory 604 stores a program 605 including a set of instructions to manipulate the processor 602 to perform one or more of the methods disclosed herein. For example, the program 605 can manipulate the processor 602 to determine a prioritization of a plurality of routability characteristics and to create a layout of a standard cell based on the prioritization.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A computer machine-implemented method, comprising:
    prioritizing a plurality of routability characteristics of a standard cell associated with an integrated circuit device design, wherein the plurality of routability characteristics are indicative of a number of different routing paths available according to which a layout tool can route connections to input/output nets of the standard cell; and
    determining a layout of transistors of the standard cell based on the prioritizing.

2. The method of claim 1, wherein prioritizing comprises determining the prioritization based on routing a plurality of test block layouts.

3. The method of claim 2, wherein the plurality of test block layouts comprises a first block layout and a second block layout, and prioritizing comprises comparing a routability characteristic of the standard cell in the first block layout with the routability characteristic of the standard cell in the second block layout.

4. The method of claim 3, wherein the standard cell is associated with a first cell layout in the first block layout and is associated with a second cell layout in the second block layout, the first cell layout different from the second cell layout.

5. The method of claim 4, wherein determining prioritizing comprises comparing a size of the first block layout with a size of the second block layout.

6. The method of claim 5, wherein the first cell layout has different routability characteristics than the second cell layout.

7. The method of claim 1, wherein determining the layout of the standard cell comprises:
modifying the layout from an unmodified layout to determine a first modified layout;
determining a first weighted sum of routability characteristics of the unmodified layout based on the prioritizing;
determining a second weighted sum of routability characteristics of the first modified layout based on the prioritizing; and
selecting a layout of the standard cell based on a comparison of the first weighted sum and the second weighted sum.

8. The method of claim 7, further comprising:
modifying the layout of the standard cell from the unmodified layout to determine a second modified layout;
determining a third weighted sum of routability characteristics of the second modified layout based on the prioritizing; and
selecting the layout of the standard cell based on a comparison of the second weighted sum and the third weighted sum.

9. The method of claim 1, further comprising producing an integrated circuit design based on modifying the layout of the standard cell.

10. A method comprising:
determining at a computer machine, based on routing information associated with a test layout, a plurality of weights, each of the plurality of weights corresponding to a different one of a plurality of routability characteristics of a standard cell;
creating at the computer device a layout of transistors of the standard cell based on the plurality of weights.

11. The method of claim 10, further comprising determining a weighted sum of the routability characteristics of the test layout, the weighted sum based on the plurality of weights.

12. The method of claim 10, wherein the plurality of routability characteristics comprises a number of hitpoints associated with the standard cell.

13. The method of claim 10, wherein the plurality of routability characteristics comprises a number of hitpoints that can be shared between input/output nets of the standard cell.

14. A on-transitory computer readable storage medium embodying a plurality of instructions to be executed by a processor, the plurality of instructions comprising instructions to:
prioritize, based on stored routing information, of a plurality of routability characteristics of a standard cell associated with an integrated circuit device design to determine a prioritization; and
determine a layout of transistors of the standard cell based on the prioritization.

15. The computer readable medium of claim 14, wherein the instructions to prioritize comprise instructions to prioritize based on routing a plurality of test block layouts.

16. The computer readable medium of claim 15, wherein the plurality of test block layouts comprises a first block layout and a second block layout, and the plurality of instructions comprise instructions to compare a routability characteristic of the standard cell in the first block layout with the routability characteristic of the standard cell in the second block layout.

17. The computer readable medium of claim 16, wherein the standard cell is associated with a first cell layout in the first block layout and is associated with a second cell layout in the second block layout, the first cell layout different from the second cell layout.

18. The computer readable medium of claim 17, wherein the instructions to prioritize comprise instructions to compare a size of the first block layout with a size of the second block layout.

19. The computer readable medium of claim 18, wherein the first cell layout has different routability characteristics than the second cell layout.

20. The computer readable medium of claim 14, wherein the instructions to determine the layout of the standard cell comprise instructions to:
modify the layout from an unmodified layout to determine a first modified layout;
determine a first weighted sum of routability characteristics of the unmodified layout based on priority;
determine a second weighted sum of routability characteristics of the first modified layout based on the prioritization; and
select a layout of the standard cell based on a comparison of the first weighted sum and the second weighted sum.

* * * * *